United States Patent [19]

Morgan

[11] Patent Number: 5,162,194
[45] Date of Patent: Nov. 10, 1992

[54] METHOD OF PROVIDING A PRINTED CIRCUIT BOARD WITH A COVER COAT

[75] Inventor: William M. Morgan, Chandlers Ford, United Kingdom

[73] Assignee: International Business Machines, Armonk, N.Y.

[21] Appl. No.: 799,721

[22] Filed: Nov. 22, 1991

Related U.S. Application Data

[63] Continuation of Ser. No. 423,166, Oct. 18, 1989, abandoned.

[30] Foreign Application Priority Data

Oct. 20, 1988 [GB] United Kingdom ............... 8824542

[51] Int. Cl.$^5$ ............................................. G03C 11/12
[52] U.S. Cl. ................................... 430/319; 430/311; 430/312
[58] Field of Search .................. 430/311, 312, 319

[56] References Cited

U.S. PATENT DOCUMENTS 4,889,790 12/1989 Roos et al. .................... 430/319

FOREIGN PATENT DOCUMENTS 58-122 1/1983 Japan .

OTHER PUBLICATIONS

IBM Technical Disclosure Bulletin, vol. 19, No. 12, May 1977, p., 4539 by Abolafia et al, "Dual Density Mask For Photoresist".
IBM (TDB) vol. 19, No. 12, May 1977, P. A. Hartley, Dual Density Mask for Photoresist (4540).
IBM (TDB) vol. 22, No. 3, Aug. 1979, Hampson, R. A., Miller, E. D., Journal Take-Up Roll for Printer Mechanism.

Primary Examiner—Marion E. McCamish
Assistant Examiner—S. Rosasco
Attorney, Agent, or Firm—Bernard Tiegerman

[57] ABSTRACT

Method of providing a printed circuit board with a cover coat on a selected area thereof characterized by the steps of:
 i) applying a photoresist material to an area of the board not to be provided permanently with a cover coat;
 ii) applying a photosensitive material to both the photoresist and the area of the board to be provided with cover coat;
 iii) blanket exposing the board to light to promote reaction of photoresist material with photosensitive material only in areas in which the photosensitive material and photoresist interface;
 iv) removing the reaction product of photoresist material and photosensitive material from the interface areas; and
 v) curing the remaining photosensitive material to convert the cover coat.

7 Claims, 1 Drawing Sheet

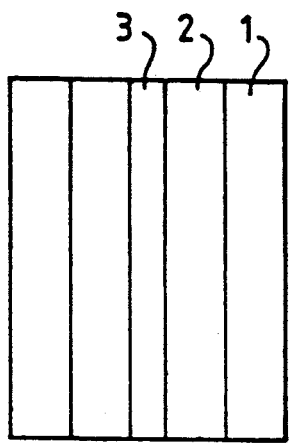
FIG. 1
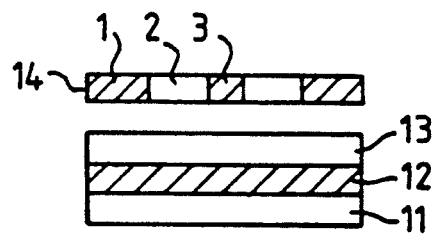
FIG. 2.1
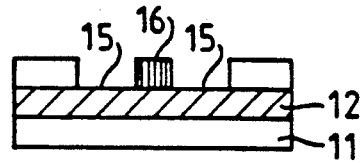
FIG. 2.2
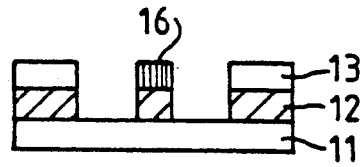
FIG. 2.3
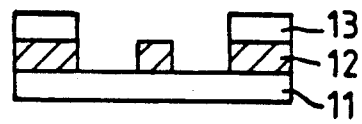
FIG. 2.4
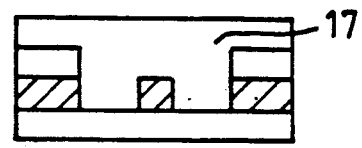
FIG. 2.5
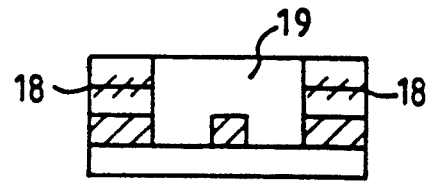
FIG. 2.6
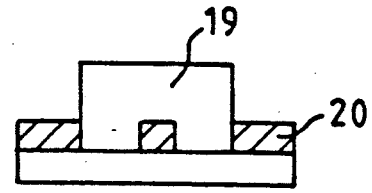
FIG. 2.7

METHOD OF PROVIDING A PRINTED CIRCUIT BOARD WITH A COVER COAT

This application is a continuation, of application Ser. No. 07/423,166, filed Oct. 18, 1989, now abandoned.

BACKGROUND OF THE INVENTION

The present invention relates to providing printed circuit boards (PCB's) with a cover coat, and in particular, to a method for creating the cover coat pattern in a photoresist overlayer simultaneously with the pattern for pads, lines, etc. in the copper foil of the board.

In the prior art, PCB's are manufactured in two basic steps. The first step is creating the pattern for the conducting material, e.g. copper, and the second step is to cover the PCB with a protective coating except on the contact pads.

In the first step a polyimide sheet substrate, e.g. of Kapton (Kapton is a registered trademark of E. I. DuPont de Nemours and Company, Wilmington, Del.), is provided with a thin foil or layer of a conductive material, such as copper. The copper is covered with a photoresist (e.g. AZ1375, which is a trademark of Shipley Co., Newton, Mass.) and a photo mask containing the circuit pattern is placed on the resist. The photoresist is exposed to light through the mask, whereby the portions that were exposed to light, are susceptible to removal by a suitable developer, whereas the unexposed areas, defining the circuit pattern, remain. After exposure the mask is removed, and the soluble areas are washed away. The exposed copper is etched away leaving a circuit pattern. The photoresist is again exposed and developed, or removed by a suitable solvent thus finishing the printed circuit panel.

In the second step the normal procedure is to blanket coat a printed circuit panel, e.g. by silk screen printing, with a negative working photo-sensitive material (by negative working is understood that illuminated parts are polymerized, whereas remaining parts can be washed away; an example of such a material is cover coat 5500 which is a trademark of Lea Ronal, Inc., Freeport, N.Y.). A photo mask, with a pattern for those areas to be covered, is aligned to the panel and exposed to light.

This alignment of the mask for the cover coat with those parts of the PCB that are not to be covered, i.e. the pads, is very difficult, especially when there is a high circuit density, and the operation is time consuming and thus very expensive.

Also known in prior art is the use of a special multi-density mask for the pattern generation. Such a mask is disclosed in IBM Technical Disclosure Bulletin Vol. 19, No. 12, May 1977, pages 4539 and 4540, and in Vol. 20, No. 3, August 1979, pages 964-5.

The described mask is such that opaque portion correspond to lands, partially transparent portions correspond to lines and fully transparent portions correspond to background substrate.

The present invention uses a modification of this mask, which will be described in detail later.

In view of the above mentioned disadvantages with prior art techniques, it is the object of the present invention to provide a method for cover coating printed circuit boards wherein the alignment problem is eliminated.

SUMMARY OF THE INVENTION

This is achieved by the invention as claimed in the appended claims in that the patterns for both the conductor layout and for the cover coat created simultaneously in one single exposure of the photo-resist through the mask.

An essential feature for being able to carry out the invention is an unexpected interaction between the photoresist and the cover coat upon exposure to light. It turns out that provided the layers of the respective materials are thin enough, there occurs a light induced reaction between the materials, rendering the exposed portions more soluble in a specific solvent, than the non-exposed portions.

One way of carrying out the invention is described in detail below with reference to the drawings, in which:

FIG. 1 is a schematic picture in top view of a mask for carrying out the invention, and FIG. 2.1–2.7 show the sequence of steps for making a PCB provided with a cover coat in accordance with the invention; the figures show cross-sections of a simplified circuit board during manufacturing.

The tri-level mask shown schematically in FIG. 1 has opaque portions (1) for creating contact pads, fully transparent portions (2) for background substrate and semi transparent (10–30% transmission) areas (3) for lines. Its function will be described below.

In FIGS. 2.1–2.7, one way of carrying out the method according to the invention is shown as a sequence of steps.

Having prepared a suitably patterned mask (FIG. 1), a substrate comprising a base material "(e.g. Kapton, a registered trademark of E. I. DuPont de Nemours and Co. for a type of polyimide)", covered over at least one surface with a thin foil of copper (12) and an overlayer of a photoresist (13) (e.g. Shipley AZ1375), is exposed to light through the mask (14) 25 shown in FIG. 2.1. The photoresist is applied as a dispersion and dried before exposure.

FIG. 2.2 shows the board after exposing to selectively wash away those parts that were fully exposed, i.e. those areas constituting the background substrate (Kapton), by using a mild developer (e.g. AZ Developer).

The circuit is etched thus removing the exposed copper areas (15) to give the board as shown in FIG. 2.3.

FIG. 2.4 shows the board after, a more aggressive developer such as Microposit 351, a developer of Shipley is used to remove the resist (16) from the areas exposed to the semi-transparent parts (3) of the mask (14), i.e. the parts constituting the lines.

A cover coat in the form of a negative working photo sensitive material such as Lea Ronal 5500 (an epoxy modified acrylic which is a mixture of epoxyacrylate and epoxy resins, also known as dipropylene glycol methyl ether), is now blanket screened onto the panel (2.5), dried and blanket exposed.

As shown in FIG. 2.5 exposure to light unexpectedly induces a modification of those parts (18) of the cover coat material that interface with the photoresist (FIG. 2.5), such that the modified material can be selectively dissolved along with the reaction products of the positive photoresist to leave a cover coated areas (19) and have pads (2) as shown in FIG. 2.7.

The mechanism or the chemistry of this phenomenon is not fully understood, but is through to be inhibition of the photo cross linking of the cover coat material by one or more components of the photo resist.

The cover coat is finally cured according to the manufacturers instructions.

Control of the time between applying an drying the cover coat allows some dissolution of the photoresist without excessive loss of definition by smearing (about 5 minutes is suitable).

The exposure time may be slightly increased to ensure complete scission of the positive photoresist under the cover coat.

The final development of the cover coat is carried out as follows:
1. 2 minute soak in aqueous alkaline solution with a pH of 12-13 containing sodium phosphates and silicates but no hydroxide.
2. Neutralize the alkali with 2-5% HCl.
3. Rinse in an organic solvent such as N-butyl-acetate or acetone.

Thus, by means of the invention a simple and inexpensive method of providing a cover coat on a PCB is disclosed. It should be evident to the skilled man that the invention can be varied within the scope of the appended claims.

What is claimed is:

1. A method of fabricating an apparatus including a substrate bearing a circuit pattern and a cover coat on a selected area of the circuit pattern-bearing substrate, comprising the steps of:
    applying a first photosensitive material to an area of said circuit pattern-bearing substrate not to be provided with said cover coat;
    applying a second photosensitive material to both said first photosensitive material and said selected area of the circuit pattern-bearing substrate to be provided with said cover coat;
    blanket exposing said circuit pattern-bearing substrate to light to promote reaction of said first photosensitive material with said second photosensitive material only in regions in which there is an interface between the first and second photosensitive materials;
    removing the reaction product of said first photosensitive material and said second photosensitive material from the interface regions; and
    curing the remaining second photosensitive material to thereby form said cover coat on said selected area.

2. The method according to claim 1, wherein said step of applying said first photosensitive material includes the steps of:
    applying a layer of metal to said substrate, which layer of metal is to be patterned to form said circuit pattern;
    applying a layer of said first photosensitive material to said layer of metal;
    simultaneously creating first and second latent images in said first photosensitive material by exposing said first photosensitive material to light through a mask, said first latent image containing a first pattern corresponding to said circuit pattern and said second latent image containing a second pattern corresponding to said cover coat;
    developing said first latent image in said layer of said first photosensitive material and then patterning said layer of metal through said developed first photosensitive material to form said circuit pattern; and
    developing said second latent image in said layer of said first photosensitive material, thereby leaving said first photosensitive material on said area of said circuit pattern-bearing substrate not to be provided with said cover coat, whereby said selected area is delineated by said first photosensitive material and the alignment of the cover coat relative to said circuit pattern is achieved.

3. The method according to claim 2, wherein said mask is a multi-density mask containing said first and second patterns corresponding to said cover coat and said circuit pattern.

4. The method according to claim 3, wherein areas of said mask defining contact pads are opaque, areas defining circuit lines are semi-transparent, and areas defining background substrate are fully transparent.

5. The method according to claim 1, wherein said second photosensitive material is an epoxy modified acrylic and said first photosensitive material is a formaldehyde novolak resin with a diazo ketone sensitizer.

6. The method according to claim 1, further comprising the step of allowing said second photosensitive material to dry for approximately 5 minutes after said step of applying said second photosensitive material and before said step of blanket exposing said circuit pattern-bearing substrate to light.

7. A method of fabricating a printed circuit board having a cover coat, comprising the steps of:
    applying a first coat of photoresist to a metallized substrate;
    exposing the first coat of photoresist to light through a mask which includes one or more first portions, one or more second portions and one or more third portions, said second portions being more transparent than said first portions and said third portions being more transparent than said second portions;
    developing the exposed first coat of photoresist in a first, relatively mild developer;
    selectively removing metallization from the substrate through the developed areas in the first coat of photoresist;
    further developing the first coat of photoresist in a second developer, relatively more aggressive than the first developer;
    applying a second coat of photoresist to said developed first coat of photoresist and to bared areas of said metallized substrate and then blanket exposing the second coat of photoresist to light; and
    selectively dissolving both first and second coats of photoresist only from any areas in which the first and second coats interface.

* * * * *